United States Patent
Wu et al.

(10) Patent No.: US 9,525,135 B2
(45) Date of Patent: Dec. 20, 2016

(54) THIXOTROPIC COMPOSITION

(71) Applicant: Xerox Corporation, Norwalk, CT (US)

(72) Inventors: Yiliang Wu, Oakville (CA); Ping Liu, Mississauga (CA); Anthony James Wigglesworth, Oakville (CA)

(73) Assignee: XEROX CORPORATION, Norwalk, CT (US)

(*) Notice: Subject to any disclaimer, the term of this patent is extended or adjusted under 35 U.S.C. 154(b) by 452 days.

(21) Appl. No.: 13/751,299

(22) Filed: Jan. 28, 2013

(65) Prior Publication Data
US 2014/0209840 A1    Jul. 31, 2014

(51) Int. Cl.
| | |
|---|---|
| *H01L 29/43* | (2006.01) |
| *H01L 51/00* | (2006.01) |
| *C08K 3/04* | (2006.01) |
| *C01B 31/02* | (2006.01) |
| *C08G 73/20* | (2006.01) |
| *H01L 51/10* | (2006.01) |

(52) U.S. Cl.
CPC ......... *H01L 51/0048* (2013.01); *C01B 31/022* (2013.01); *C08G 73/20* (2013.01); *C08K 3/04* (2013.01); *H01L 51/0035* (2013.01); *H01L 51/0036* (2013.01); *H01L 51/0043* (2013.01); *C08G 2261/1412* (2013.01); *C08G 2261/3223* (2013.01); *C08G 2261/51* (2013.01); *C08G 2261/92* (2013.01); *H01L 29/43* (2013.01); *H01L 51/0003* (2013.01); *H01L 51/105* (2013.01)

(58) Field of Classification Search
None
See application file for complete search history.

(56) References Cited

U.S. PATENT DOCUMENTS

| | | | |
|---|---|---|---|
| 6,621,099 B2 | 9/2003 | Ong et al. | |
| 6,770,904 B2 | 8/2004 | Ong et al. | |
| 6,774,393 B2 | 8/2004 | Murti et al. | |
| 6,949,762 B2 | 9/2005 | Ong et al. | |
| 7,875,878 B2 | 1/2011 | Wu et al. | |
| 8,319,206 B2 | 11/2012 | Wu et al. | |
| 2008/0191198 A1* | 8/2008 | Han et al. | 257/40 |

(Continued)

FOREIGN PATENT DOCUMENTS

| | | | | |
|---|---|---|---|---|
| JP | 2005089738 A | * | 4/2005 | |
| WO | WO 2008048238 A2 | * | 4/2008 | ............. B82Y 10/00 |

OTHER PUBLICATIONS

Applied Science Innovations Pvt. Ltd., India (product description for "Multi-walled Carbon Nanotubes", accessed online at http://www.applied-science-innovations.com/ASIPL-MWCN.pdf, shown to be available on the Internet Archive Wayback Machine on Apr. 10, 2011 and attached to the case file as a PDF).*

(Continued)

*Primary Examiner* — Mark Kopec
*Assistant Examiner* — Katie L Hammer
(74) *Attorney, Agent, or Firm* — Fay Sharpe LLP (57) ABSTRACT

A thixotropic conductive composition is disclosed that can be used to form conductive features on an electronic device. The thixotropic composition comprises a conjugated polymer, a solvent, and multi-wall carbon nanotubes. The conjugated polymer and the solvent are capable of forming a thixotropic fluid. This enables excellent stability of the carbon nanotubes in the composition at a very high loading. The composition has a long shelf life.

20 Claims, 5 Drawing Sheets

(56) References Cited

U.S. PATENT DOCUMENTS

| | | | |
|---|---|---|---|
| 2008/0234424 A1* | 9/2008 | Lee et al. | 524/495 |
| 2009/0140236 A1* | 6/2009 | Wu et al. | 257/40 |
| 2009/0140237 A1* | 6/2009 | Wu et al. | 257/40 |
| 2011/0065232 A1* | 3/2011 | Wu et al. | 438/99 |
| 2011/0248401 A1* | 10/2011 | Hellstrom et al. | 257/741 |
| 2012/0104328 A1* | 5/2012 | Park | B82Y 10/00 252/510 |
| 2012/0175564 A1* | 7/2012 | Jin et al. | 252/500 |
| 2012/0187379 A1 | 7/2012 | Wu et al. | |
| 2012/0187380 A1 | 7/2012 | Wu | |

OTHER PUBLICATIONS

Sanada et al. (JP 2005-089738 A) English text machine translation, accessed on the JPO AIPN website on Jun. 2, 2015 and attached to the case file as a PDF.*

Chen, Xin ("Synthesis and Characterization of Polythiophene Derivatives", ProQuest, May 2007, The University of Texas at Arlington, title pages and pp. 15-20 are attached as a PDF to the case file).*

Mittal, V. ((2011) Carbon Nanotubes Surface Modifications: An Overview, in Surface Modification of Nanotube Fillers (ed V. Mittal), Wiley-VCH Verlag GmbH & Co. KGaA, Weinheim, Germany. doi: 10.1002/9783527635085.ch1, pp. 1-23; published online on Apr. 27, 2011; accessed from the Wiley Online Library; copy attached to the case file as a PDF.*

Christos D. Dimitrakopoulos et al., "Organic Thin Film Transistors for Large Area Electronics," *Adv. Mater.*, vol. 14, No. 2, pp. 99-117 (2002).

* cited by examiner

THIXOTROPIC COMPOSITION

BACKGROUND

The present disclosure relates to compositions that can be used to form conductive features and have a good shelf life prior to usage. Methods for making and using the same are also disclosed.

Organic thin-film transistors (OTFTs) can be used in applications such as radio frequency identification (RFID) tags and backplane switching circuits for displays, such as signage, readers, and liquid crystal displays, where high switching speeds and/or high density are not essential. They also have attractive mechanical properties such as being physically compact, lightweight, and flexible.

OTFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio. High mobility and high on/off ratio are desired.

Both the mobility and on/off ratio are affected by the total resistance between the source and drain electrodes. If the total resistance is high, then high electrical field strengths are necessary to inject and extract charge carriers. One component of the total resistance is the contact resistance at the interface of each electrode and the semiconductor layer. Contact resistance is generally minimized by selecting an electrode material having a work function identical or very close to the energy level of the semiconductor. The energy level is the highest occupied molecular orbital (HOMO) of the semiconductor in the case of p-type semiconductor or the lowest unoccupied molecular orbital (LUMO) of the semiconductor in the case of n-type semiconductor.

For the electrodes, another key measure of performance is the conductivity. Generally, higher conductivity indicates better performance.

Organic thin-film transistors can be fabricated using low-cost solution-based patterning and deposition techniques, such as spin coating, solution casting, dip coating, stencil/screen printing, flexography, gravure, offset printing, ink jet-printing, micro-contact printing, and the like. To enable the use of these solution-based processes in fabricating thin-film transistor circuits, solution processable materials are therefore required.

It would be desirable to develop solution-processable compositions that exhibit good film-forming properties and can be used to form conductive features, such as electrodes.

BRIEF DESCRIPTION

The present disclosure provides, in various embodiments, solution-processable conductor compositions that have a good shelf life and can be used to form conductive features, such as electrodes in a transistor. The compositions are thixotropic.

Disclosed in some embodiments is a conductor composition, comprising: a solvent; a conjugated polymer; and multi-wall carbon nanotubes. The solvent and the conjugated polymer form a thixotropic fluid.

In particular embodiments, the solvent is 1,2-dichlorobenzene.

The conjugated polymer may be a polythiophene of Formula (I):

Formula (I)

wherein A is a divalent linkage; wherein each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and wherein n is from 2 to about 5,000.

In more particular embodiments, R is alkyl having from about 6 to about 25 carbon atoms.

In other embodiments, the conjugated polymer is a polythiophene of Formula (II):

Formula (II)

wherein m is from 2 to about 2,500.

The weight ratio of the multi-wall carbon nanotubes to the conjugated polymer may be at least 2:1. Sometimes, the multi-wall carbon nanotubes are at least 50 wt % of all solids in the conductor composition. In some embodiments, the conjugated polymer is less than 2.0 wt % of the composition.

The multi-wall carbon nanotubes can be surface-modified with a conjugated group selected from the group consisting of thiophene-based oligomers and polymers, pyrenes, phthalocyanines, polyphenylvinylidenes, polyfluorenes, polycarbazoles, polytriarylamines, and polyphenylenes.

In particular embodiments, the multi-wall carbon nanotubes are surface-modified with thiophene-based oligomers or polymers of Formula A or B:

Formula A

Formula B wherein x, y, and z are independently integers from 0 to 7; m is an integer from 1 to 3; n is an integer from 1 to 50; w is an integer from 0 to 5; R and R' are independently selected from hydrogen, halogen, alkyl, alkoxyalkyl, siloxyalkyl, and perfluoroalkyl; and D is a divalent linkage.

The multi-wall carbon nanotubes may be surface-modified with a non-conjugated group selected from the group consisting of polymers or oligomers of polyurethane, polystyrene, polyvinyl alcohol, polyacrylate, polyimide, polyester, polyamide, and polysiloxane; hydrocarbon groups containing 1 to 30 carbon atoms; and heteroatom-containing groups including halogen, alkoxy, alkoxyalkyl, cyano, or nitro.

In other embodiments, the multi-wall carbon nanotubes are surface-modified with a group comprising an acidic moiety, the acidic moiety being selected from the group consisting of carboxylic acid, sulfonic acid, phosphinic acid, sulfuric acid, nitric acid, and phosphoric acid.

The multi-wall carbon nanotubes may be, in some embodiments, at least 40% of metallic carbon nanotubes.

Also disclosed in embodiments herein is a conductive film, comprising: a conjugated polymer; and multi-wall carbon nanotubes; wherein the multi-wall carbon nanotubes are at least 50 wt % of the conductive film.

The conductive film may have a conductivity of at least 1 S/cm. The weight ratio of the multi-wall carbon nanotubes to the conjugated polymer can be at least 2:1.

In some embodiments, the conjugated polymer is a polythiophene of Formula (I):

Formula (I)

wherein A is a divalent linkage; wherein each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and wherein n is from 2 to about 5,000.

In other embodiments, the conjugated polymer is a polythiophene of Formula (II):

Formula (II)

wherein m is from 2 to about 2,500.

The conductive film may have a % light transmission of at least 85% when measured according to ASTM 01746.

Also disclosed in various embodiments is an electronic device comprising a conductive layer made from a conductor composition that comprises: a solvent; a conjugated polymer; and multi-wall carbon nanotubes; wherein the solvent and the conjugated polymer form a thixotropic fluid. The conductive layer can be an electrode of a transistor.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

Figure 1:
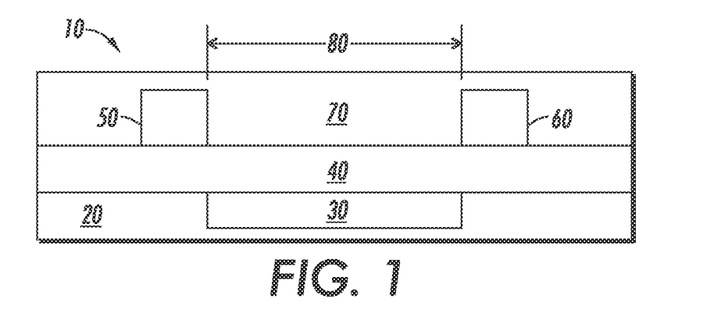
FIG. 1 is a first embodiment of a TFT that can use conductive films of the present disclosure.

FIG. 1 illustrates a bottom-gate bottom-contact TFT configuration according to the present disclosure. The TFT 10 comprises a substrate 20 in contact with the gate electrode 30 and a gate dielectric layer 40. Although here the gate electrode 30 is depicted within the substrate 20, this is not required. However, it is important that the gate dielectric layer 40 separates the gate electrode 30 from the source electrode 50, drain electrode 60, and the semiconducting layer 70. The semiconducting layer 70 runs over and between the source and drain electrodes 50 and 60. The semiconductor has a channel length 80 between the source and drain electrodes 50 and 60.

Figure 2:
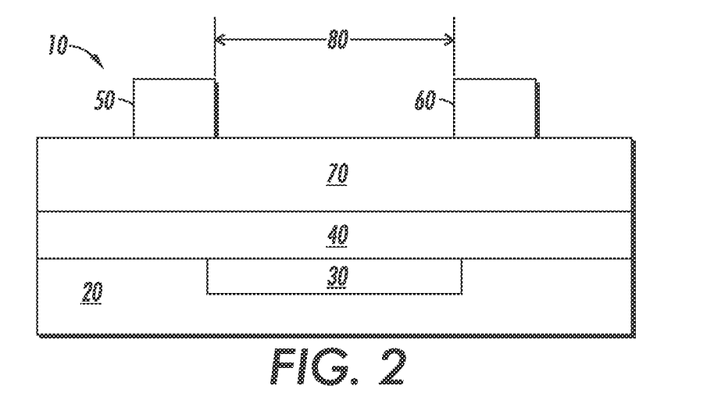
FIG. 2 is a second embodiment of a TFT that can use conductive films of the present disclosure.

FIG. 2 illustrates another bottom-gate top-contact TFT configuration according to the present disclosure. The TFT 10 comprises a substrate 20 in contact with the gate electrode 30 and a gate dielectric layer 40. The semiconducting layer 70 is placed on top of the gate dielectric layer 40 and separates it from the source and drain electrodes 50 and 60.

Figure 3:
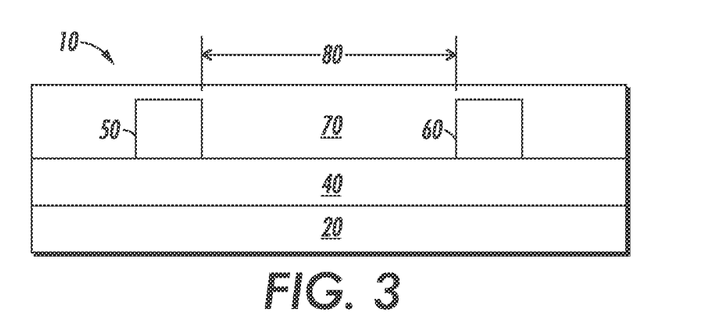
FIG. 3 is a third embodiment of a TFT that can use conductive films of the present disclosure.

FIG. 3 illustrates a bottom-gate bottom-contact TFT configuration according to the present disclosure. The TFT 10 comprises a substrate 20 which also acts as the gate electrode and is in contact with a gate dielectric layer 40. The source electrode 50, drain electrode 60, and semiconducting layer 70 are located atop the gate dielectric layer 50.

Figure 4:
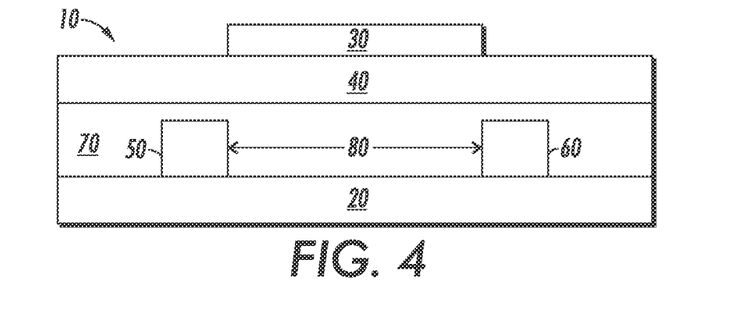
FIG. 4 is a fourth embodiment of a TFT that can use conductive films of the present disclosure.

FIG. 4 illustrates a top-gate top-contact TFT configuration according to the present disclosure. The TFT 10 comprises a substrate 20 in contact with the source electrode 50, drain electrode 60, and the semiconducting layer 70. The semiconducting layer 70 runs over and between the source and drain electrodes 50 and 60. The gate dielectric layer 40 is on top of the semiconducting layer 70. The gate electrode 30 is on top of the gate dielectric layer 40 and does not contact the semiconducting layer 70.

As previously discussed, the electrodes in an organic electronic device should provide sufficient conductivity and a proper work function to match the organic semiconductor with which the electrodes are interfacing. The present disclosure relates to a conductor composition which can be used to make conductive features such as electrodes using solution processing methods. The conductor composition comprises (A) a conjugated polymer, (B) a solvent, and (C) multi-wall carbon nanotubes (MWNTs). The conjugated polymer in the solvent are capable of forming a thixotropic fluid. This thixotropic property enables excellent stability of the MWNTs at a very high MWNT loading. The conductor composition also has a good shelf life. When cast into a conductive film, this polymer-MWNT composite has very high conductivity.

The conductor composition comprises a conjugated polymer (A). Exemplary conjugated polymers include polythiophenes as discussed herein. Any other conjugated polymer, such as polypyrroles, polycarbazoles, polyindoles, polyindolocarbazoles, poly-p-phenylenes, poly-p-phenylvinylidenes, polyfluorene, polynphthalenes, polypyrenes, or the like, can be used as well, as long as the conjugated polymer can form a thixotropic solution in the solvent.

In particular embodiments, the conductor composition of the present disclosure comprises a polythiophene having the structure of Formula (I):

Formula (I)

wherein A is a divalent linkage; wherein each R is independently selected from hydrogen, alkyl, substituted alkyl, alkenyl, substituted alkenyl, alkynyl, substituted alkynyl, aryl, substituted aryl, alkoxy, substituted alkoxy, a heteroatom-containing group, halogen, —CN, or —NO$_2$; and wherein n is from 2 to about 5,000. The polythiophene of Formula (I) is a homopolymer.

The term "alkyl" refers to a radical composed entirely of carbon atoms and hydrogen atoms which is fully saturated. The alkyl radical may be linear, branched, or cyclic.

The term "alkylene" refers to a radical composed entirely of carbon atoms and hydrogen atoms, and having the ability to form a single bond with two different non-hydrogen atoms. An alkylene radical has the formula —C$_n$H$_{2n}$—.

The term "alkenyl" refers to a radical composed entirely of carbon atoms and hydrogen atoms which contains at least one carbon-carbon double bond that is not part of an aryl or heteroaryl structure. The alkenyl radical may be linear, branched, or cyclic.

The term "alkynyl" refers to a radical composed entirely of carbon atoms and hydrogen atoms which contains at least one carbon-carbon triple bond.

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). Exemplary aryl groups include phenyl, biphenyl, and fluorenyl.

The term "arylene" refers to an aromatic radical having the ability to form a single bond with two different non-hydrogen atoms. An exemplary arylene is phenylene (—C$_6$H$_4$—).

The term "alkoxy" refers to an alkyl radical which is attached to an oxygen atom, i.e. —O—C$_n$H$_{2n+1}$.

The term "heteroatom-containing group" refers to a cyclic radical containing at least one heteroatom in a ring of the cyclic radical. The cyclic radical may be aromatic or non-aromatic. The heteroatom is generally nitrogen, oxygen, or sulfur.

The term "substituted" refers to at least one hydrogen atom on the named radical being substituted with another functional group, such as halogen, —CN, —NO$_2$, —COOH, or —SO$_3$H. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an alkyl, alkylene, alkenyl, or alkynyl group may also be substituted with an aryl group. An exemplary substituted alkenyl group is phenylethenyl (—CH=CH—C$_6$H$_5$). An exemplary substituted alkynyl group is phenylethynyl (—C≡C—C$_6$H$_5$). An aryl, arylene, or heteroatom-containing group may also be substituted with alkyl or alkoxy. Exemplary substituted aryl groups include methylphenyl and methoxyphenyl. Exemplary substituted arylene groups include methylphenylene and methoxyphenylene.

Generally, the alkyl, alkylene, alkenyl, alkynyl, and alkoxy groups each independently contain from 1 to 30 carbon atoms, but in particular embodiments may have from 2 to 10 carbon atoms. Similarly, the aryl and arylene groups independently contain from 6 to 30 carbon atoms. In embodiments, n is from about 5 to about 5,000.

The term "divalent linkage" refers to any moiety which is able to form a single bond with two different non-hydrogen atoms, joining those two different atoms together. Exemplary divalent linkages include —O—, —NH—, alkylene, and arylene.

The divalent linkage A forms a single bond to each of the two thienyl moieties in Formula (I). Exemplary divalent linkages A include:

and combinations thereof, wherein each R' is independently selected from hydrogen, alkyl, substituted alkyl, aryl, substituted aryl, alkoxy or substituted alkoxy, a heteroatom-containing group, halogen, —CN, or —NO$_2$. One or more of these moieties may be present in divalent linkage A. In addition, one or more of a particular moiety may be present in divalent linkage A.

It should be noted that the divalent linkage A will always be different from the two thiophene monomers shown in Formula (I); in other words, Formula (I) will not reduce to being a polythiophene made from only one moiety. In particular embodiments, A is a thienyl moiety which is different from that of the two thiophene moieties shown in Formula (I). For example, R and R' are not the same when A is a thienyl moiety.

In specific embodiments of Formula (I), R is alkyl having from about 6 to about 25 carbon atoms. In some embodiments, the polythiophene may have the structure of Formula (II):

Formula (II)

wherein m is from 2 to about 2,500. The polythiophene may be referred to as PQT-12.

Desirably, the conjugated polymer has a high weight average molecular weight. In some embodiments, the conjugated polymer has a weight average molecular weight at least 20,000, or at least 50,000, or at least 100,000, or at least 200,000 when measured relative to polystyrene standards by gel permeation chromatography (GPC).

The conductor composition of the present disclosure also comprises a solvent (B) that is capable of forming a thixotropic fluid with the conjugated polymer. A "thixotropic" fluid exhibits a time-dependent change in viscosity when exposed to shear stress. Put another way, a thixotropic fluid is thick (i.e. has a high viscosity) under normal conditions, but becomes thinner (i.e. reduces viscosity) when agitated. The solvent is also generally capable of dissolving the conjugated polymer and the multi-wall carbon nanotubes can be dissolved or dispersed. Exemplary solvents include chlorinated solvents such as 1,2-dichlorobenzene, chlorobenzene, or chlorotoluene; and aromatic hydrocarbons such as toluene, ethylbenzene, xylene, trimethybenzene, anisole, or tetrahydronaphthalene. In particular embodiments, the solvent is a chlorinated solvent.

It should be noted that not all combinations of conjugated polymer and solvent form a thixotropic fluid. For example, while PQT-12 and 1,2-dichlorobenzene can form a thixotropic fluid, PQT-12 cannot form a thixotropic fluid with toluene. As another example, poly(1-methoxy-4-(2-ethylhexyloxy-2,5-phenylenevinylene) (MEH-MPV) can formed a thixotropic fluid with benzene or toluene, but MEH-MPV cannot form a thixotropic fluid with dichlorobenzene.

In some embodiments, no additional thixotropic agents are added into the conductor composition, or in other words the conjugated polymer and the selected solvent form a thixotropic solution, no additional thixotropic agent is added. For example, the conductor composition does not contain fumed silica, precipitated silica, fine talc, or chalk, or any other thickening agent.

The conductor composition of the present disclosure also comprises multi-wall carbon nanotubes (MWNTs). Carbon nanotubes are an allotrope of carbon. They take the form of cylindrical carbon molecules and exhibit extraordinary strength, unique electrical properties, and efficient heat conductor properties. The diameter of a nanotube is small, typically on the order of from about one-half nanometer to about a few nanometers. The length of a nanotube is typically larger, sometimes up to several millimeters. In other words, the carbon nanotubes may have a high aspect ratio, i.e. ratio of length to diameter. A multi-wall carbon nanotube is composed of a number of cylindrical carbon nanotubes having different diameters, which are formed concentrically around each other. Each carbon nanotube in the multi-wall carbon nanotube can have any suitable length and diameter.

The multi-wall carbon nanotubes may be surface-modified. The surface modifying group can be attached on the exposed surface of any carbon nanotube, on the wall of the outermost nanotube, or at the ends of any of the carbon nanotubes. The surfaces of the carbon nanotubes can be modified in two ways: non-covalent attachment and covalent attachment.

In embodiments, the surface modification may be represented by the following formula:

CNT-R$_1$—R$_2$ wherein CNT represents the carbon nanotube, R$_1$ is a linking group selected from ester (—COO—) and amide (—CONH—); and R$_2$ is a conjugated group, a non-conjugated group, a small molecular group, an inorganic material, and combinations thereof. The degree of surface modification may vary from about one group per carbon nanotube to about one thousand groups per carbon nanotube.

The multi-wall carbon nanotubes may be modified with a conjugated group, a non-conjugated group, an inorganic material, and combinations thereof.

Exemplary conjugated groups may include thiophene-based oligomers, pyrenyl, fluorenyl, carbazolyl, triarylamine, and phenyl. The conjugated group can be covalently bonded directly to the surface of a carbon nanotube or through a linking group, such as amide or ester.

Exemplary non-conjugated groups may include alkyl, alkoxy, cyano, nitro, urethane, styrene, acrylate, amide, imide, ester, and siloxanes. Also included are non-conjugated groups comprising an acidic moiety, selected from the group consisting of carboxylic acid, sulfonic acid, phosphinic acid, sulfuric acid, nitric acid, phosphoric acid, and the like. In specific embodiments, the surface-modified carbon nanotubes are modified with carboxylic acid, sulfuric acid, and nitric acid.

Exemplary inorganic materials include metals and metal oxides such as gold, silver, copper, nickel, zinc, cadmium, palladium, platinum, chromium, aluminum, ZnO, ZnSe, CdSe, $Zn_aIn_bO_c$ (where a, b, and c are integers), GaAs, $ZnO.SnO_2$, $SnO_2$, gallium, germanium, tin, indium, indium oxide, indium tin oxide, and the like. The inorganic material may homogenously cover the exposed surfaces of the multi-wall carbon nanotubes or be in nanoparticle form on the exposed surfaces of the multi-wall carbon nanotubes. In specific embodiments, the surface-modified carbon nanotubes are modified with nanoparticles selected from the group consisting of gold, silver, nickel, copper, ZnO, CdSe, $Zn_aIn_bO_c$, GaAs, $ZnO.SnO_2$, $SnO_2$, and ZnSe nanoparticles.

In some specific embodiments, the exposed surfaces of the carbon nanotubes are modified with thiophene-based oligomers and/or polymers of Formula A or B:

Formula A

Formula B wherein x, y, and z are independently integers from 0 to 7; m is an integer from 1 to 3; n is an integer from 1 to 50; w is an integer from 0 to 5; R and R' are independently selected from hydrogen, halogen, alkyl, alkoxyalkyl, siloxyalkyl, and perfluoroalkyl; and D is a divalent linkage. In specific embodiments, D is arylene, substituted arylene, heteroarylene, or substituted heteroarylene. In more specific embodiments, D is phenylene, thienothiophene, benzothiophene, carbazole, indolocarbazole, fluorene, benzodithiophene. In other specific embodiments, R and R' are selected from alkyl. In more specific embodiments, R and R' are alkyl from about 1 to about 25, including from about 4 to about 18 carbon atoms, and further including from about 6 to about 16 carbon atoms. Examples of D include phenylene, biphenylene, phenanthrenylene, dihydrophenanthrenylene, fluorenylene, oligoarylene, and dioxyarylene. In further specific embodiments of Formula A or B, x, y, and z are independently integers from 1 to 7; m is an integer from 1 to 3; n is an integer from 1 to 3; w is from 0 to 5; R and R' are independently selected from hydrogen, halogen, alkyl, alkoxyalkyl, siloxyalkyl, and perfluoroalkyl; and D is a divalent linkage.

Modifying the surfaces of the carbon nanotubes can enable better miscibility between the multi-wall carbon nanotubes and the conjugated polymer (such as the polythiophene of Formula (I)). This can increase solubility or aid in creating the thixotropic property of the conductor composition.

Carbon nanotubes can be surface modified by suitable methods. For example, a reactive site can be created on the carbon nanotubes, then an oligomer or small molecular compound can be grafted onto the nanotubes at that reactive site. Another approach involves the introduction of carboxylic acid groups onto a carbon nanotube surface via an acid treatment. For example, a mixture of sulfuric acid and nitric acid can be used to form carboxylic acid groups on the surface of a carbon nanotube. Other surface modifying groups can then react with the carboxylic acid group. Other approaches include plasma treatment or direct reaction with highly reactive chemicals such as dichlorocarbene.

As previously mentioned, the loading of multi-wall carbon nanotubes (MWNTs) can be very high in the conductor composition. In some embodiments, the multi-wall carbon nanotubes are at least 50 wt % of all solids in the conductor composition. Generally, the solids present in the conductor composition include the multi-wall carbon nanotubes and the conjugated polymer. The weight ratio of the multiwall carbon nanotube to the conjugated polymer may be at least 1:1, or at least 2:1. In particular embodiments, the conjugated polymer is less than 5.0 wt %, including less than 2.0 wt %, of the conductor composition. Due to the thixotropic property of the conductor composition, the MWNTs can be stabilized at very high concentrations for a long time period, enabling a longer shelf life.

Processes for making the conductor composition are also disclosed. Generally, the conjugated polymer (A) and the multi-wall carbon nanotubes (C) are dispersed in the solvent (B). This can be enhanced by heating the solvent to elevated temperature, or by ultrasonication. The ultrasonication can be performed by probe sonication or by bath sonication. The term "probe sonication" refers to sonication wherein a probe is inserted into a container containing the dispersion. The term "bath sonication" refers to sonication wherein the container containing the dispersion is placed into a bath, and the bath is subsequently sonicated. Probe sonication provides much greater energy/power compared to bath sonication.

The conductor composition has a viscosity at least 50 centipoise (cps), or at least 100 cps, or at least 200 cps at low shear rates such as 1.0 Hz (per second) at room temperature. When high shear strength is applied, the conductor composition has a dramatically reduced viscosity, for example less than 50 cps, less than 20 cps, or less than 10 cps at a shear rate of 500/s at room temperature. "Room temperature" refers to a temperature of 23° C. to 25° C.

Conductive films may be formed with the conductor composition using conventional processes known in the art. In embodiments, the conductive film is formed using solution depositing techniques. Exemplary solution depositing techniques include spin coating, blade coating, rod coating, dip coating, screen printing, ink jet printing, stamping, stencil printing, screen printing, gravure printing, flexography printing, and the like. The conductive film can be used, for example, as an electrode.

When cast into a conductive film, the multi-wall carbon nanotubes (MWNTs) are at least 50 weight percent of the conductive film. The conductivity of the conductive film is higher than the conductivity of a benchmark polymer, poly(3,4-ethylenedioxythiophene):poly(styrene sulfonic acid) (PEDOT:PSS). The conductivity of the conductive film may be at least 1 S/cm, or at least 5 S/cm, or at least 10 S/cm. this is due to the high loading of MWNTs in the conductive film.

In particular, the conductive film can be transparent, especially after the conjugated polymer is photo-bleached. The transparency of the conductive film can be measured using light transmittance. In embodiments, the conductive film may have a light transmittance of at least 85%, when measured according to ASTM D1746.

Electronic devices comprising the conductor composition or conductive film described above are also disclosed. In some embodiments, the electronic devices are thin-film transistors. In other embodiments, the electronic devices are photovoltaic devices.

A thin film transistor generally includes a substrate, a dielectric layer, and a semiconducting layer in addition to the optional gate electrode, the source electrode, and the drain electrode.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

In the present disclosure, the dielectric layer may be surface modified with a surface modifier. Exemplary surface modifiers include small molecular silane agents such as hexamethyldisilazane (HMDS) and octyltrichlorosilane (OTS-8), or polymeric modifiers such as a polysilsesquioxane, a polysiloxane, or a fluoropolymer. The semiconducting layer can be directly contacted with this modified dielectric layer surface. The contact may be complete or partial. This surface modification can also be considered as forming an interfacial layer between the dielectric layer and the semiconducting layer.

Materials suitable for use as the organic semiconducting layer include acenes, such as anthracene, tetracene, pentacene, and substituted pentacenes, perylenes, fullerenes, phthalocyanines, oligothiophenes, polythiophenes, and substituted derivatives thereof. In embodiments, the organic semiconductor layer is formed from a liquid processable material. Examples of suitable semiconductor materials include polythiophenes, oligothiophenes, and the semiconductor polymers described in U.S. Pat. Nos. 6,621,099, 6,774,393, 6,770,904,and 6,949,762,the disclosures of which are incorporated herein by reference in their entireties. Additionally, suitable materials include the semiconductor polymers disclosed in "Organic Thin-film transistors for Large Area Electronics" by C. D. Dimitrakopoulos and P. R. L. Malenfant, Adv. Mater., Vol. 14,No. 2,pp. 99-117 (2002), the disclosure of which is also incorporated herein by reference.

The semiconductor layer may be formed by any suitable means including but not limited to vacuum evaporation, spin coating, solution casting, dip coating, stencil/screen printing, flexography, gravure, offset printing, inkjet-printing, micro-contact printing, a combination of these processes, and the like. In embodiments, the semiconductor layer is formed by a liquid deposition method. In embodiments, the semiconductor layer has a thickness of from about 10 nanometers to about 1 micrometer. In further embodiments, the organic semiconductor layer has a thickness of from about 30 to about 150 nanometers. In other embodiments, the semiconductor layer has a thickness of from about 40 to about 100 nanometers.

Typically, it is considered the conductor compositions of the present disclosure will be used to form at least one electrode of the electronic device. If desired, the other electrodes of the electronic device can be made from different materials. Other examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The electrode(s) can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical thicknesses of source and drain electrodes are, for example, from about 40 nanometers to about 1 micrometer, including more specific thicknesses of from about 100 to about 400 nanometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer. The resulting TFT has good mobility and good current on/off ratio.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

The conjugated polymer PQT-12 (see Formula (II)) was used in the Examples. PQT-12 is capable of forming a gel in 1,2-dichlorobenzene solvent. Upon shaking or sonication, the gel will become a flowable fluid.

Example 1

Three different suspensions were prepared that contained PQT-12, 1,2-dichlorobenzene, and multi-wall carbon nanotubes (MWNTs). The concentration of PQT-12 was kept constant at 0.1 wt %. The weight ratio of MWNTs to PQT-12 in the three suspensions were 1:1, 3:2,and 2:1. The suspensions were sonicated for 1 hour in bath to initially break up any large aggregates. Further sonication was performed by probe (50% power) for 3 minutes to ensure the MWNTs were separated as much as possible.

As a comparative example, a suspension was made using the same procedure containing 0.1 wt % PEDOT:PSS in water and a 1:1 weight ratio of MWNTs to PEDOT:PSS.

The PQT-12/MWNT conductor compositions formed a gel at room temperature without agitation or shaking, indicating a thixotropic composition. Upon sonication, the high viscosity gel became a low viscosity fluid at room temperature. After sonication, the suspensions were spin-coated onto glass slides. The substrates were wiped with isopropanol and plasma cleaned in air for 1 minute. The suspensions were spin coated at 1000 rpm for 1 minute with a 5 second ramp time. After spin-coating, the films were dried in a vacuum oven for 20 minutes at 70° C. The films were then characterized for their conductivity using a 4-point probe measurement station.

Figure 5:
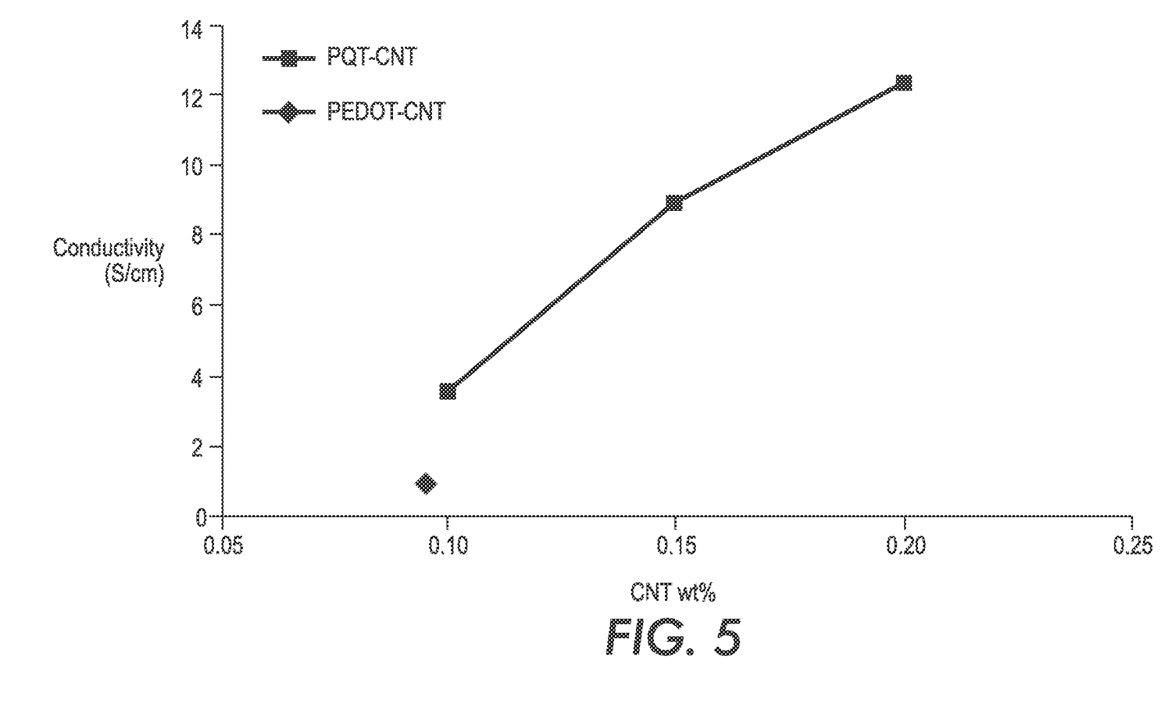
FIG. 5 is a graph showing the conductivity vs. amount of carbon nanotubes.

FIG. 5 is a graph showing the conductivity versus the MWNT concentration. As seen here, the conductivity of the PEDOT-MWNT film was noticeably lower than that of the three PQT-MWNT films. The weight ratio of MWNT:PQT-12 increased, the conductivity increased as well. It should be noted that dispersing of MWNTs into PEDOT:PSS at high loadings is very difficult.

Example 2

Figure 6:
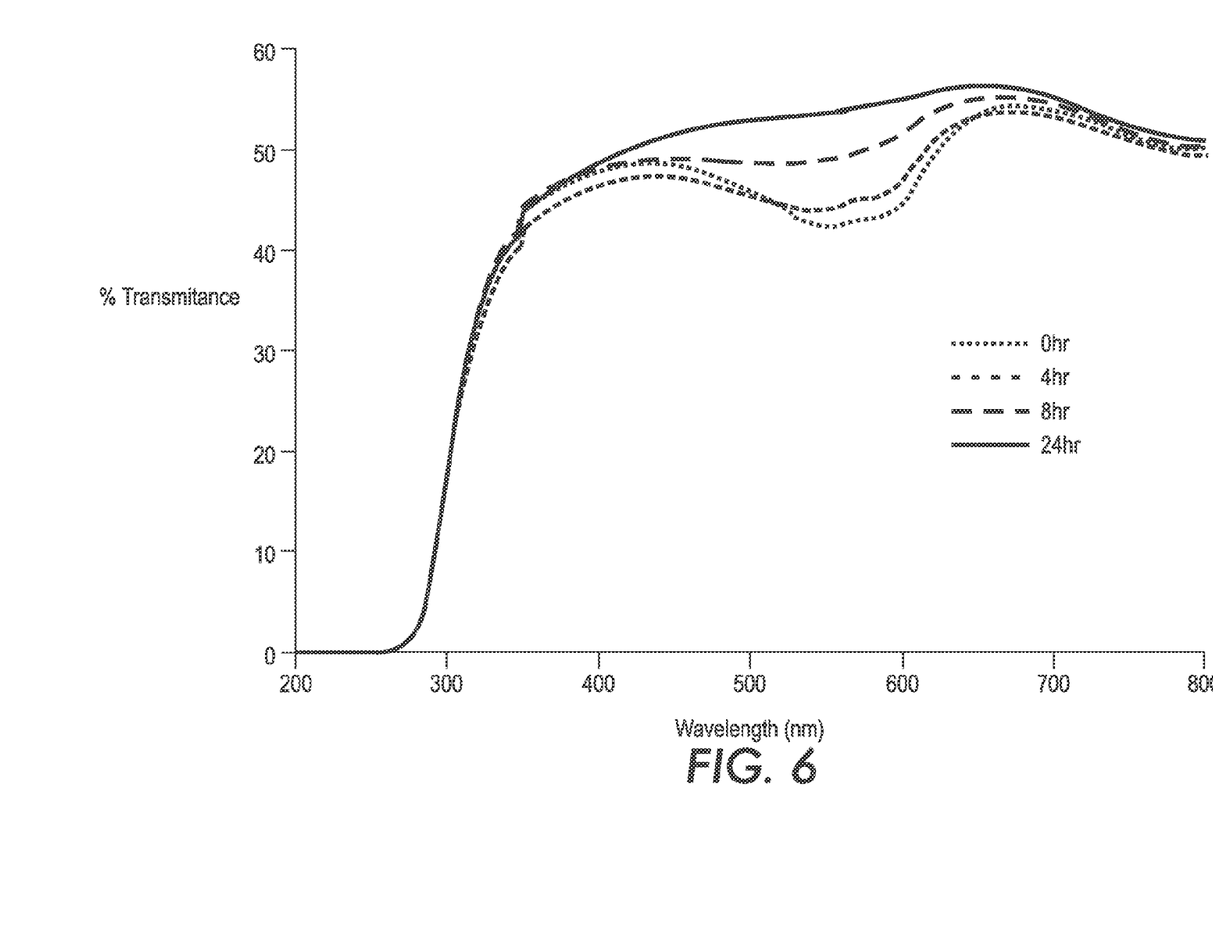
FIG. 6 is a graph showing the transmittance vs. wavelength for conductive films exposed to UV light for varying periods of time.

The thicknesses of the MWNT:PQT-12 films were roughly 50 nanometers (nm), which resulted in reasonable optical transparency. Transmittance of the film after spin-coating on glass was characterized using UV-Vis spectroscopy. After spin-coating, the transmittance in the optical region was 40-50%. In an attempt to improve this value, the films were subjected to UV radiation for different durations to degrade the PQT-12 polymer. FIG. 6 shows the transmittance vs. wavelength for four different exposure times (0, 4, 8,and 24 hours) for a MWNT:PQT-12 film having a weight ratio of 2:1. As seen here, the transmittance in the visible spectrum (350 nm to 750 nm) was increased after UV exposure. Conductivity was again measured after the UV exposure, and showed no noticeable change in electrical performance.

Example 3

Next, the conductive MWNT:PQT-12 films were investigated for use as electrodes in a transistor. Silicon wafer surfaces were modified with octyltrichiorosilane. The MWNT:PQT-12 suspension with a weight ratio of 2:1 was then drop cast on the modified surfaces and dried in vacuum at 70° C. for 20 minutes. After drying, the drop was separated into electrodes by scratching a channel through the film.

For comparison, a set of gold electrodes was evaporated on the same modified surfaces and used without further treatment.

A diketopyrrolopyrrole-bithiophene (DKPP-BT) copolymer having the structure of Formula (C) was used to form the semiconducting layer:

Formula (C)

A solution of 0.5 wt % DKPP-BT in trichloroethane was spin-coated on top of the electrodes at 2000 rpm for 120 seconds with a 2 second ramp time. The final wafers were dried in vacuum at 70° C. for 30 minutes before being annealed at 140° C.

Figure 7:
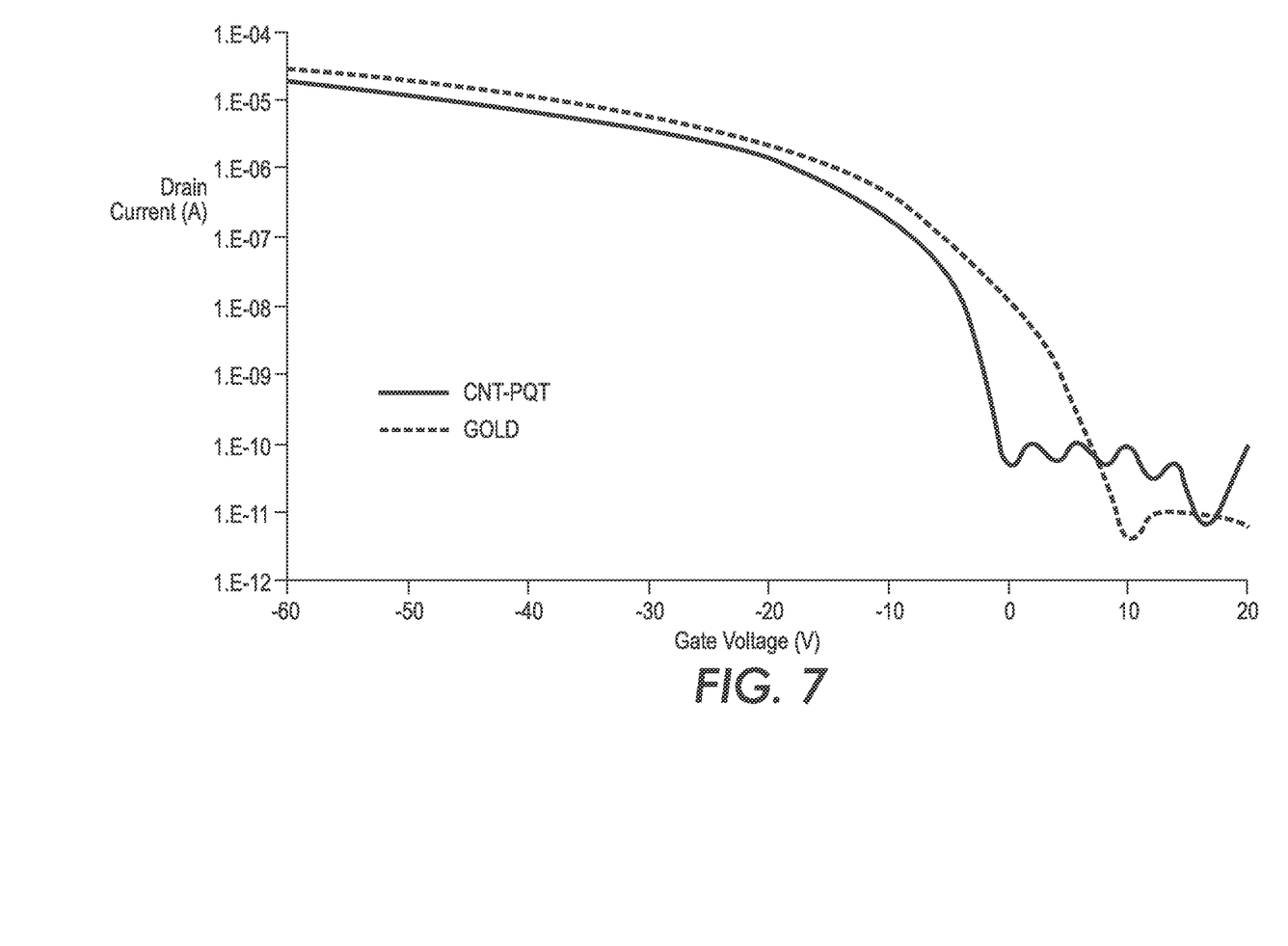
FIG. 7 is a graph showing the transfer curve for the conductive films versus gold.

FIG. 7 shows the transfer curves for the devices with electrodes made of either 2:1 MWNT:PQT-12 or gold. The device with the MWNT:PQT-12 composite film had a transfer curve that was almost identical to the device having gold electrodes. In other words, the device with the MWNT:PQT-12 composite electrodes showed similar mobility and current on/off ratio to the device having gold electrodes. It is believed that the conjugated polymer provides good energy matching (work function), while the MWNTs provide high conductivity.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A conductor composition, comprising:
a solvent;
a polythiophene conjugated polymer of Formula (II):

Formula (II)

wherein m is from 2 to about 2,500; and
multi-wall carbon nanotubes;
wherein the solvent and the conjugated polymer form a thixotropic fluid; and
wherein the multi-wall carbon nanotubes are at least 50 wt % of all solids in the conductor composition, and wherein the weight ratio of the multi-wall carbon nanotubes to the conjugated polymer is at least 2:1.

2. The conductor composition of claim 1, wherein the solvent is 1,2-dichlorobenzene.

3. The conductor composition of claim 1, wherein the conjugated polymer is less than 2.0 wt % of the composition.

4. The conductor composition of claim 1, wherein the multi-wall carbon nanotubes are surface-modified with a covalently attached conjugated group selected from the group consisting of thiophene-based oligomers and polymers, pyrenes, phthalocyanines, polyphenylvinylidenes, polyfluorenes, polycarbazoles, polytriarylamines, and polyphenylenes.

5. The conductor composition of claim 1, wherein the multi-wall carbon nanotubes are surface-modified with covalently attached thiophene-based oligomers or polymers of Formula A or B:

Formula A

Formula B wherein x, y, and z are independently integers from 0 to 7; m is an integer from 1 to 3; n is an integer from 1 to 50; w is an integer from 0 to 5; R and R' are independently selected from hydrogen, halogen, alkyl, alkoxyalkyl, siloxyalkyl, and perfluoroalkyl; and D is a divalent linkage.

6. The conductor composition of claim 1, wherein the multi-wall carbon nanotubes are surface-modified with a covalently attached non-conjugated group selected from the group consisting of polymers or oligomers of polyurethane, polystyrene, polyvinyl alcohol, polyacrylate, polyimide, polyester, polyamide, and polysiloxane; hydrocarbon groups containing 1 to 30 carbon atoms; and heteroatom-containing groups including halogen, alkoxy, alkoxyalkyl, cyano, or nitro.

7. The conductor composition of claim 1, wherein the multi-wall carbon nanotubes are surface-modified with a covalently attached group comprising an acidic moiety, the acidic moiety being selected from the group consisting of carboxylic acid, sulfonic acid, phosphinic acid, sulfuric acid, nitric acid, and phosphoric acid.

8. A conductive film, comprising:
a polythiophene conjugated polymer of Formula (II):

Formula (II)

wherein m is from 2 to about 2,500; and
multi-wall carbon nanotubes;
wherein the multi-wall carbon nanotubes are at least 50 wt % of the conductive film, and wherein the weight ratio of the multi-wall carbon nanotubes to the conjugated polymer is at least 2:1; and
wherein the film has a thickness of from about 40 nanometers to about 1 micrometer.

9. The conductive film of claim 8, having a conductivity of at least 1 S/cm.

10. The conductive film of claim 8, wherein the film has a % light transmission of at least 85% when measured according to ASTM D1746.

11. An electronic device comprising a conductive layer made from a conductor composition that comprises:
a solvent;
a polythiophene conjugated polymer of Formula (II):

Formula (II)

wherein m is from 2 to about 2,500; and
multi-wall carbon nanotubes;
wherein the solvent and the conjugated polymer form a thixotropic fluid, wherein the multi-wall carbon nanotubes are at least 50 wt % of the conductive layer, and wherein the weight ratio of the multi-wall carbon nanotubes to the conjugated polymer is at least 2:1.

12. The electronic device of claim 11, wherein the conductive layer is an electrode of a transistor.

13. The electronic device of claim 11, wherein the conductive layer has a thickness of from about 40 nanometers to about 1 micrometer.

14. The conductive film of claim 8, wherein the thickness is from about 100 to about 400 nanometers.

15. The electronic device of claim 11, wherein the conductive layer has a thickness of from about 100 nanometers to about 400 nanometers.

16. The electronic device of claim 11, wherein the conductive layer has a % light transmission of at least 85% when measured according to ASTM D1746.

17. The electronic device of claim 11, wherein the conductive layer has been photo-bleached.

18. The conductive film of claim 8, wherein the conductive film has been photo-bleached.

19. The conductive film of claim 8, having a conductivity of at least 5 S/cm.

20. The conductive film of claim 8, having a conductivity of at least 10 S/cm.

* * * * *